United States Patent [19]

Fraas

[11] 4,063,974

[45] Dec. 20, 1977

[54] PLANAR REACTIVE EVAPORATION METHOD FOR THE DEPOSITION OF COMPOUND SEMICONDUCTING FILMS

[75] Inventor: Lewis M. Fraas, Malibu, Calif.

[73] Assignee: Hughes Aircraft Company, Culver City, Calif.

[21] Appl. No.: 631,981

[22] Filed: Nov. 14, 1975

[51] Int. Cl.² .................... H01L 21/205; H01L 21/18
[52] U.S. Cl. ...................................... 148/175; 118/49; 156/611; 156/612; 219/275; 427/87; 427/248 R; 427/248 A
[58] Field of Search ................ 148/175; 156/611, 612; 427/69, 81, 87, 248; 118/48, 49, 49.1, 49.5; 219/271, 275; 432/92; 266/149

[56] References Cited

U.S. PATENT DOCUMENTS

| | | |
|---|---|---|
| 3,218,205 | 11/1965 | Ruehrwein ............................ 148/175 |
| 3,271,561 | 9/1966 | Fiedler et al. .......................... 219/271 |
| 3,419,487 | 12/1968 | Robbins et al. .................... 148/175 X |
| 3,540,926 | 11/1970 | Rairden .............................. 427/248 X |
| 3,615,931 | 10/1971 | Arthur .................................. 148/175 |
| 3,661,117 | 5/1972 | Cornelius et al. ...................... 118/48 |
| 3,666,553 | 5/1972 | Arthur et al. ..................... 148/175 X |
| 3,716,405 | 2/1973 | Lim .................................... 148/175 X |
| 3,915,765 | 10/1975 | Cho et al. .............................. 148/175 |
| 3,928,092 | 12/1975 | Ballamy et al. ........................ 148/175 |

OTHER PUBLICATIONS

Morris et al., "A New GaAs, GaP . . . Vacuum Deposition . . ." J. Vac. Sci. Technol., vol. 11, No. 2, Mar.-/Apr. 1974, pp. 506–510.

Tietjen et al., "Preparation . . . $InAs_{1-x}P_x$ . . . Phosphine," J. Electrochem. Soc., Apr. 1969, vol. 116, No. 4, pp. 492–494.

*Primary Examiner*—L. Dewayne Rutledge
*Assistant Examiner*—W. G. Saba
*Attorney, Agent, or Firm*—B. T. Hogan, Jr.; W. H. MacAllister

[57] ABSTRACT

An apparatus and method for epitaxial film formation is disclosed. Planar reactive evaporation techniques suitable for scaling are employed to produce high purity compound semiconducting films at relatively low temperatures.

15 Claims, 3 Drawing Figures

PLANAR REACTIVE EVAPORATION METHOD FOR THE DEPOSITION OF COMPOUND SEMICONDUCTING FILMS

BACKGROUND OF THE INVENTION

1. Field of the Invention

This invention is directed to the vapor phase formation of compound semiconducting films in general and particularly to the formation of indium phosphide and gallium phosphide films on single crystal substrates.

2. Description of the Prior Art

Compound semiconductor films in general have been used extensively in various electronic devices as, for example, the fabrication of laser diodes, microwave oscillators and photoelectric detectors. In microwave applications, thin film semiconductors are required for high frequency response characteristics.

Semiconductor quality InP epitaxial thin films have been deposited via Chemical Vapor Deposition (CVD) (R. C. Clarke, B. D. Joyce and W. H. E. Wilgoss, *Solid State Communications,* Vol. 8, p. 1125, 1970) and Liquid Phase Epitaxy (LPE) (J. L. Shay, K. J. Bachmann and E. Buehler, *Appl. Phys. Lett.,* Vol. 24, p. 192, 1974). However, these techniques require temperatures above 500° C. For some applications, lower substrate temperatures are required. For example, substrate decomposition limits the substrate temperature for certain heterojunction photoelectric devices. Specifically, a terrestrial solar cell incorporating InP deposited on CdS would have a potentially high energy conversion efficiency (Sigurd Wagner, J. L. Shay, K. T. Bachmann, E. Buehler, *Appl. Phys. Lett.,* Vol. 26, p. 229, 1975), but fabrication of such a device would have to be accomplished below approximately 400° C to avoid CdS decomposition. Another application involving lower substrate temperatures would be abrupt junction microwave devices such as InP Gunn Effect devices. In this instance, lower temperatures would alleviate interdiffusion effects.

Molecular beam techniques have been used successfully by various workers (A. Y. Cho, *J. of Vacuum Science and Technology,* Vol. 8, p. 531, 1971; D. L. Smith and V. Y. Pickhardt, *J. of Appl. Physics,* Vol. 46, p. 2366, 1975) for the deposition of semiconductor epitaxial films at low temperatures. However, problems arise with this technique in producing the appropriate phosphorus vapor species (C. T. Foxon, B. A. Joyce, R. F. C. Farrow and R. M, Griffiths, *J. Phys. D.,* Vol. 7, p. 2422, 1974) for InP deposition. Additionally, this technique severely limits the uniform deposition area and therefore is not scalable. This arises because two sources are used. These sources are at two different temperatures and, therefore, must be thermally isolated from each other. This isolation requirement leads to the limited uniformity in the deposited films (see U.S. Pat. No. 3,615,931 by J. R. Arthur et al).

Reactive evaporation techniques have been used to deposit polycrystalline semiconductor compounds on single crystal substrates. (F. J. Morris et al, *J. Vac Sci. Technol.,* Vol. II, No. 2, page 506, March 1974.) However, films deposited via this technique were neither single crystal films nor of high purity and therefore were not of semiconductor quality. The techniques disclosed by Morris et al. are not readily scalable and fail to control sources of impurities during the deposition process.

There are no prior art processes known to me which facilitate the simultaneous production of high purity semiconductor quality films at low processing temperatures by a scalable method.

THE INVENTION

Summary

Objectives of this invention are: to deposit heteroepitaxially semiconductor quality ($\leqq$ 5 ppm impurity content) thin ($\leqq$ 5 $\mu$) films; to deposit these films on substrates at relatively low temperatures ($\leqq$ 500° C); to deposit these films at economical rates ($\sim$5 $\mu$/hour); and to deposit these films in a fasion amenable to eventual production scales.

In meeting these objectives, a novel scalable vapor phase deposition apparatus and method for the preparation of compound semiconductor (MX) films which meets all of the above-listed objectives while avoiding the pitfalls of prior art processes has been developed.

The key to this process lies in the development of a method for controlling the production of M and X component vapors. This method was rendered feasible with the development of a novel source design for the production of M and X component vapors. This source consists of a perforated dish made from an inert material with a hollow cavity into which an X component hydride gas is introduced. X may be any element from Group V or VI of the Periodic Table.

The M component (a metal from Group II or III of the Periodic Table) is placed in the perforated dish and elevated to a temperature suitable for evaporation of the metal component and the dissociation of the X hydride gas into X vapors and hydrogen gas. The metal vapor pressure and the X component vapor pressure are controlled independently by the cavity temperature and an X hydride metering value.

This source is placed in a chamber pumped by a turbomolecular pump to ensure removal of unreacted hydrogen gas and other residual impurities. The source and substrate region is surrounded by a liquid nitrogen cooled shroud which also aids in reducing residual impurity gas pressures. This shroud effectively forms an inner source substrate deposition chamber providing an improved impurity level deposition region.

BRIEF DESCRIPTION OF THE DRAWINGS

The nature or scope of this invention may be readily understood by reference to the drawings where.

DESCRIPTION OF THE INVENTION

MX compounds, where M is a metal taken from Groups II and III of the periodic table and X is an element taken from Groups V and VI of the periodic table, have utility in the preparation of semiconducting films. Thin films comprised of single crystal MX compounds coated onto single crystal substrates are exceedingly difficult to prepare and are very costly. This is particularly true of those MX compounds which decompose at elevated temperatures with high X component vapor pressures. Notable examples of such compounds are InP, GaP, and CdS. A large part of the difficulty in preparing such films is attributed to the problems associated with handling the X component vapor species of the MX compound.

In order to facilitate the handling of X component vapor species, a reactive evaporative deposition technique has been devised in which the X component is introduced into the deposition environment via X hydride decomposition. Two immediate advantages of this technique are the ease of control of the X component vapor species and source scalability. The control of X component vapor pressure allows independent adjustment of the X component to M component pressure ratio which facilitates the production of stoichiometric films. Since the source is planar, it is scalable and therefore large substrate areas may be coated. This facilitates large production rates.

The ability to control the component vapor pressures allows the deposition of MX compounds at a lower rate which favors lower deposition substrate temperatures. Temperatures on the order of 350° C and less than 500° C have been shown to be adequate when the deposition rate is less than 5 $\mu$/hour. Chemical Vapor Deposition techniques, in contrast, generally involve deposition rates on the order of 50 $\mu$/hour and therefore require epitaxial temperatures about 500° C.

High purity films are obtained by operating with residual gas pressures of less than $10^{-9}$ torr. Such low pressures are obtained by operation in a high vacuum chamber ($<10^{-8}$ torr) and employing a liquid nitrogen cooled shroud to create an inner source substrate deposition chamber.

Figure 1:
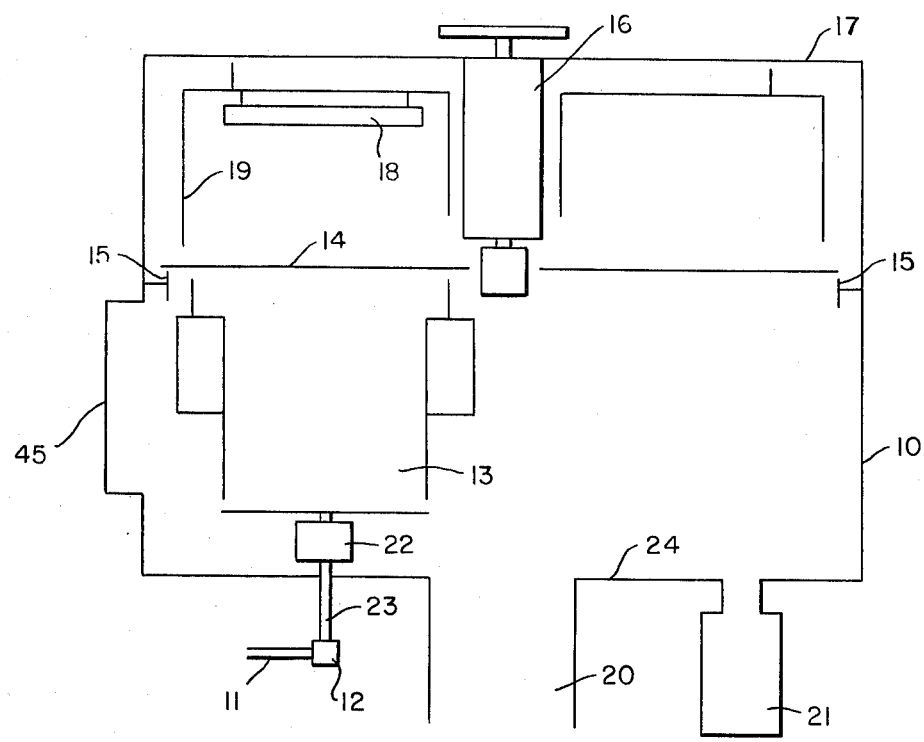
FIG. 1 is a schematic line drawing of the Planar Reactive Evaporative Deposition Apparatus.

Thin films are prepared by the technique described above by utilizing a planar reactive evaporative apparatus as shown in FIG. 1. The essential features of this apparatus are: a vacuum chamber enclosure 10 fabricated from metal in accordance with conventional vacuum technologies; an X component hydride inlet line 11 fabricated from stainless steel equipped with a metering valve 12 which serves to control the X component introduction rate into an inner source substrate deposition chamber 13. A rotatable substrate mounting plate 14 fabricated from molybdenum is mounted above the deposition chamber 13 on plate support bearings 15, mounted on the inner walls of the vacuum chamber enclosure 10.

Rotation of the substrate plate 14 is manually accomplished via a bellows sealed rotating feedthrough 16 which extends through the chamber lid 17.

Substrates to be coated are mounted on the substrate plate 14 and heated via substrate heater lamps 18 mounted in a heater chamber 19 attached to the inner surface of the chamber lid 17.

The vacuum chamber 10 is connected to a turbomolecular pump 20 used to maintain a high vacuum and remove residual gases. A residual gas analyzer 21 is used to monitor the impurity gas levels within the chamber 10.

A dopant source oven 22 is mounted below the inner source substrate deposition chamber 13 on an inlet feedthrough line 23 which extends through the vacuum chamber base plate 24 and connects to the metering valve 12 which controls the flow of X component hydride gas from the hydride inlet line 11.

Figure 2:
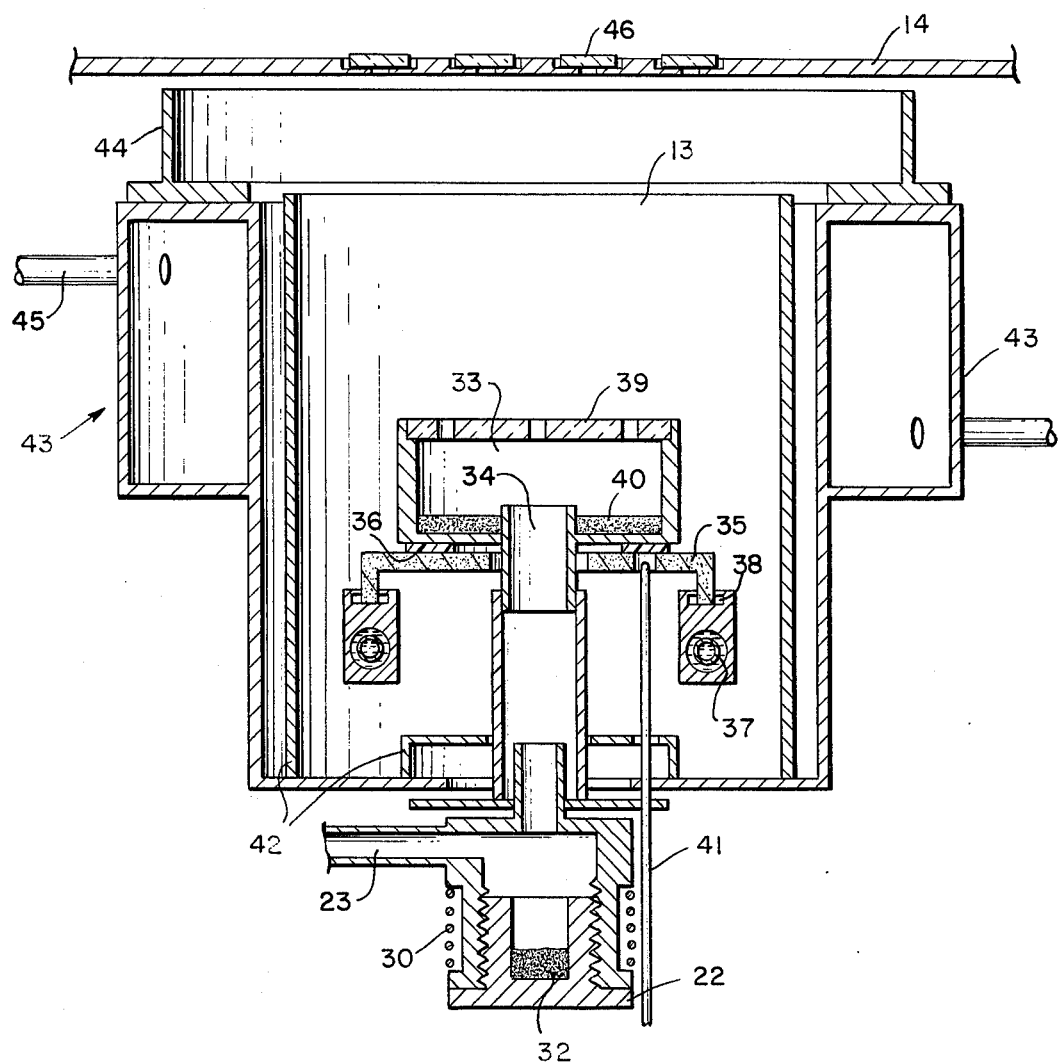
FIG. 2 is an expanded plan view of the preferred Inner Source Substrate Deposition Chamber.

A more detailed drawing of the inner source substrate chamber 13 and the dopant source oven 22 is shown in FIG. 2. Here, X component hydride gas flowing through the inlet feedthrough line 23 passes through the dopant source oven 22. The dopant source oven 22 is fabricated from molybdenum or tantalum. The temperature of the oven 22 is controlled by heater coils 30 wrapped about its periphery and monitored by a thermocouple not shown.

The dopant 32 in the dopant source oven 22 is vaporized and carried by an X component hydride gas stream into the source cavity 33 via a source cavity inlet tube 34.

The walls and the bottom surface of the source cavity 33 are composed of ultra pure alumina, graphite, or boron nitride. The source cavity 33 is electrically insulated from a graphite heater plate 35 by non-conducting insulator spacers 36. The graphite heater plate 35 is electrically heated by current which flows between water cooled copper electrodes 37. Electrical coupling between the heater plate 35 and the copper electrodes 37 is accomplished via a liquid gallium coupling 38.

The source cavity 33 is equipped with a perforated sapphire top plate 39 which serves to direct M, X, and $H_2$ vapor streams towards the substrates to be coated.

The temperature of the M component of the MX compound 40 contained in the bottom of the source cavity 33 is monitored by a tantalum sheathed thermocouple 41.

Refractory metal heat shields 42 surround the source cavity 33 and thermally isolate the source cavity 33 and heater plate 35 from a cooled metallic shroud 43. The shroud 43 provides a condensation surface protecting the inner deposition chamber 13 from residual gas impurities present in the outer vacuum chamber 10. Further protection against residual gases entering the deposition chamber is obtained by an optically dense metal baffle 44 mounted onto the top of the shroud 43. The metal baffle 44 is sized such that the distance between it and the substrate mounting plate 14 is minimal.

Coolants for the shroud 43 and an electrical current for the water cooled copper electrodes 37 are provided from a side port 45 located in the vacuum chamber wall 10.

Figure 3:
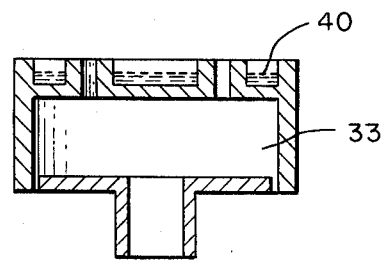
FIG. 3 is an expanded plan view of an alternative design for the MX source chamber.

An alternative source cavity design is shown in FIG. 3. This source design differs from that of 33 in FIG. 2 in that it operates with the M vapor in a free evaporative condition. The Knudson source design of FIG. 2 operates with the M component vapor pressure in the equilibrium condition.

The above-described apparatus is used to prepare compound semiconducting films in general as follows: single crystal substrates 46 to be coated are mounted on the substrate mounting plate 14 and placed in the vacuum chamber 10 on the plate support bearings 15 mounted on the inner wall of the vacuum chamber. The standard sample load configuration consists of several samples in each of three of the four substrate plate quadrant positions. The fourth quadrant position contains a blank plate. Initially, this blank position is centered above the source chamber for source bakeout. The loding and unloading of samples is done in flowing dry nitrogen or argon gas to reduce the water vapor build-up on the chamber walls.

The source and dopant chambers will have been previously loaded with a suitable M component and dopant.

The apparatus is closed and evacuated to $<10^{-8}$ torr with the turbomolecular pump 20. The use of a turbomolecular pump instead of a diffusion pump is necessary to maintain an oil-free system, and also to allow good pumping speeds even at moderate chamber pressures. This follows because even an adequately trapped diffusion pump should be throttled down at pressures above $3 \times 10^{-4}$ torr to avoid oil vapor back-streaming.

The substrate heaters 18 are activated and the substrate plate 14 temperature is raised to a temperature between the film epitaxial temperature and substrate decomposition temperature. The source temperature is then raised to approximately 100° C below the temperature at which the M component vapor pressure becomes appreciable but above the decomposition temperature of the X component hydride. The source temperature and substrate plate temperature are held at these values until residual gases are baked out of the inner deposition chamber and the pressure restabilizes. The pressures of the various residual gases are monitored with the residual gas analyzer 21.

The temperature of the shroud is lowered by the introduction of a liquid coolant (preferably liquid nitrogen). This step provides for a reduction of residual gas impurities within the chamber 10. The substrate samples 46 may now be cleansed of any oxide surface coatings by thermally baking them either in an ultra high vacuum or in the presence of an X component vapor species and hydrogen gas. The cleansing method utilized will vary as a function of substrate material composition.

In the case of InP P films deposited epitaxially on InP single crystals, removal of the oxide surface coating is accomplished by heating the InP substrates in the presence of phosphorus vapors and hydrogen gas.

In the case of InP films deposited epitaxially on CdS single crystals, removal of oxide surface coatings may be accomplished by thermally baking the CdS substrates in a high vacuum.

Once the shroud has been cooled and the system stabilized, the metering valve 12 is opened to allow X component hydride gas to enter the source chamber 33. When the pressure within the chamber stabilizes, the source temperature is increased to a value such that the M component vapor pressure reaches the desired level and deposition begins.

Dopants may be provided via one of two methods. The first method would involve placing a solid dopant source in the dopant oven 22 and raising the temperature of the oven to a predetermined level for the desired dopant concentration during the deposition on the blank substrate quadrant. In the second case the dopant may be premixed with the X component hydride and introduced with the X component hydride when the metering valve is opened.

The deposition rate is a function of the source temperature. Source cleaning is continued on the blank sample position for a brief period and then the samples are rotated into position in succession for deposition.

Specific control parameters for the use of this apparatus and method to prepare InP films are shown below: In the source chamber, the M component is In and the X component hydride is phosphine ($PH_3$). Substrate temperatures of 350°-400° C are employed. The source temperature is initially raised to 700° C for bakeout. This temperature exceeds the decomposition temperature of $PH_3$. A needle valve setting sufficient to yield a hydrogen plus phosphorus vapor pressure within the chamber of $3 \times 10^{-4}$ torr and a source temperature of 900° C give a deposition rate of 2 $\mu$/hr.

Extension to materials other than InP is accomplished as follows: a straightforward substitution of Ga for In would allow GaP deposition, and a further substitution of $AsH_3$ gas for $PH_3$ gas would allow the deposition of InAs and GaAs. Similarly, substituting CdS for In and $H_2S$ for $PH_3$ would allow CdS deposition and likewise for other II-IV or IV-VI materials. The method is most useful for the deposition of stoichiometric compound semiconductor films in which one of the species in the compound is quite volatile.

Although in the above description pure X component hydride gases were introduced through the metering valve, it is also possible to use mixtures of X component hydride gas and hydrogen gas. In this instance, the extra hydrogen gas would act as a carrier gas and provide a reducing atmosphere in the deposition chamber. This would allow a reduction of oxygen impurities incorporated in the growing films.

What is claimed is:

1. A method of heteroepitaxially depositing MX compound films onto a single crystal substrate at low temperatures where M is a metal taken from the group consisting of the elements in Groups II and III of the periodic table and X is an element taken from the group consisting of the elements in Groups V and VI of the periodic table comprising the steps of:
   a. preheating said substrate to a temperature above the film epitaxial temperature and below the decomposition temperature of said substrate,
   b. creating an ultra-pure reaction environment within a planar evaporative source cavity by evacuating a vacuum chamber surrounding said cavity and said substrates to an atmospheric pressure of less than $10^{-8}$ torr,
   c. creating a negative temperature gradient between said source cavity and said substrate by raising the temperature of said cavity to a temperature sufficient to cause an appreciable increase in the vapor pressure of an M component metal placed in said cavity,
   d. introducing an X-component hydride gas at a controlled flow rate of the order of $3 \times 10^{-4}$ torr into said planar source cavity whereby the elevated temperature of said cavity will cause said gas to dissociate in the presence of said M component vapors to form an M component vapor-X component vapor and $H_2$ gas mixture, and
   e. directing said mixture to said substrate whereby said M component will react with said X component vapors deposited on the surface of said substrate to form an MX compound film and said $H_2$ gas will be evacuated from said chamber.

2. The method of claim 1 wherein said hydride gas is introduced into said cavity by a hydrogen gas hydride gas mixture.

3. The method of claim 1 wherein said substrate is an InP single crystal, said M component is In, said X component hydride is phosphine and said MX film is an InP film.

4. The method of claim 3 wherein said substrate temperature ranges from 350° to 400° C and said source temperature ranges from 700° to 900° C.

5. The method of claim 4 wherein the flow rate of said hydride gas is such that a hydrogen and phosphorus vapor pressure of approximately $3 \times 10^{-4}$ torr is created within said cavity.

6. The method of claim 5 wherein said hydride gas in introduced into said cavity by a mixture of hydrogen and phosphine gas.

7. The method of claim 1 wherein said substrate is a CdS crystal or film, said M component is In, and said X component hybrid is $PH_3$.

8. A method of heteroepitaxially depositing MX compound films onto a single crystal substrate at low temperatures where M is a metal taken from the group consisting of the elements in Groups II and III of the periodic table and X is an element taken from the group consisting of the elements in Groups V and VI of the periodic table comprising the steps of:
   a. precharging a planar source cavity with an M component metal,
   b. placing said substrates, in a spaced relationship with respect to said cavity, in a vacuum chamber which encloses said cavity,
   c. evacuating said vacuum chamber to an atmospheric pressure of less than $10^{-8}$ torr,
   d. increasing the temperature of said source cavity to a level sufficient to increase the vapor pressure of the M component metal while simultaneously increasing the substrate temperature to a level between the MX film epitaxial temperature and the substrate decomposition temperature whereby a negative temperature gradient between said source cavity and said substrate is created,
   e. introducing said X component of said MX compound into said source cavity by causing an X component hybride gas to flow into said cavity at a predetermined rate on the order of $3 \times 10^{-4}$ torr whereby said gas decomposes into hydrogen and X component vapors thereby forming a hydrogen gas, X-component mixture with said M component vapors and
   f. causing said vapor mixture to be directed to the surface of said substrate whereby said vapors will condense and react to form an MX compound film thereby releasing said $H_2$ gasses to be evacuated from said chamber.

9. The method of claim 8 wherein said substrate is an InP crystal, said films are InP films, said M component metal is In and said X component hydride gas is $PH_3$.

10. The method of claim 9 wherein said cavity temperature is increased to a range of 700° – 900° C, and said substrate temperature ranges between 350° and 400° C.

11. The method of claim 10 wherein the flow rate of said X component hydride gas is such that a hydrogen-phosphorous vapor pressure of $3 \times 10^{-4}$ torr is created within said cavity.

12. The method of claim 8 wherein said X component is introduced into said cavity by a mixture of hydrogen and phosphine gasses.

13. The method of claim 8 wherein said substrate is CdS said films are InP films, said n component metal in In, and said X component hydride is $PH_3$.

14. A low temperature method of heteroepitaxially depositing MX compound films onto a single crystal substrate where M is a metal taken from the group consisting of the elements in Groups II and III of the periodic table and X is an element taken from the group consisting of the elements in Groups V and VI of the periodic table comprising the steps of:
   a. precharging an inert planar source cavity with said M component metal, said source chamber being comprised of a dish and perforated top plate, said dish being mounted on and electrically insulated from a means for raising the temperature of said dish and connected to an inlet line whereby an X component hydride gas may be introduced,
   b. placing said substrates in a vacuum chamber, having a means for raising the temperature of said substrates and the capacity for being evacuated to an atmospheric pressure of less than $10^{-8}$ torr, in a space relationship to said planar source cavity top while purging said vacuum chamber with an inert gas,
   c. evacuating said vacuum chamber to a pressure of less than $10^{-8}$ torr while raising the temperature of the substrates to a temperature between the film epitaxial temperature and substrate decomposition temperature by activating said second temperature means and raising the M component source temperature to a level between the decomposition temperature of the X component source and that temperature which causes the vapor pressure of said M component to become appreciable,
   d. baking out residual gases by allowing the elevated source and substrate temperatures to remain constant until the pressure within the vacuum chamber restabilizes,
   e. lowering the temperature of a deposition chamber around surrounding said source cavity by introducing a gaseous coolant into said shroud whereby any residual gas impurities within said chamber are trapped, said shroud having an optically dense baffle mounted on its top thereby providing additional impurity trapping surfaces,
   f. increasing said source cavity temperature to a value such that the M component vapor pressure reaches the desired level while introducing an X component hydride gas at a controlled rate on the order of $3 \times 10^{-4}$ torr whereby said gas will dissociate and form a mixture of M vapors, X vapors and hydrogen gas, and
   g. directing said mixture to the surface of said substrate whereby said M and X vapors will deposit and react to form said MX compound film, and said $H_2$ gases will be evacuated from said chamber.

15. The method of claim 14 wherein said substrate is an InP single crystal, said M component metal is In, said X component hydride is $PH_3$ and said MX compound is InP.

* * * * *